(12) United States Patent
Kim et al.

(10) Patent No.: US 11,637,034 B2
(45) Date of Patent: Apr. 25, 2023

(54) APPARATUS AND METHOD FOR MANUFACTURING DISPLAY DEVICE

(71) Applicant: Samsung Display Co., Ltd., Yongin-si (KR)

(72) Inventors: Kyung Sik Kim, Suwon-si (KR); Yong Lim Kim, Asan-si (KR); Kyo Sung Lee, Cheonan-si (KR); Seung Kuk Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/993,592

(22) Filed: Aug. 14, 2020

(65) Prior Publication Data

US 2020/0373189 A1    Nov. 26, 2020

Related U.S. Application Data

(62) Division of application No. 16/057,536, filed on Aug. 7, 2018, now Pat. No. 10,784,141.

(30) Foreign Application Priority Data

Sep. 19, 2017   (KR) ........................ 10-2017-0120467

(51) Int. Cl.
*H01L 21/683*   (2006.01)
*H01L 21/68*    (2006.01)
(Continued)

(52) U.S. Cl.
CPC ........ *H01L 21/6838* (2013.01); *G02F 1/1303* (2013.01); *G02F 1/133351* (2013.01);
(Continued)

(58) Field of Classification Search
CPC ... B24B 49/12; H01L 21/6838; H01L 21/681; H01L 23/544; H01L 2202/022;
(Continued)

(56) References Cited

U.S. PATENT DOCUMENTS 6,203,082 B1 *   3/2001   Bendat ................. B25J 15/0616
                                                                294/185
7,165,669 B2 *   1/2007   Menschig ........... H01L 21/6776
                                                                198/750.12
(Continued)

FOREIGN PATENT DOCUMENTS

CN         103376586 A     10/2013
CN         105977184 A      9/2016
(Continued)

OTHER PUBLICATIONS

Chinese Office action issued in corresponding application No. CN 201811018519.7, dated Nov. 23, 2022, 9 pages.

*Primary Examiner* — Nhat Chieu Q Do
(74) *Attorney, Agent, or Firm* — Lewis Roca Rothgerber Christie LLP

(57) ABSTRACT

An apparatus for manufacturing a display device and a method for manufacturing a display device are provided. According to an exemplary embodiment of the present disclosure, an apparatus for manufacturing a display device includes: a pressing pad including a body portion and a vision hole penetrating the body portion; a vision camera above the vision hole; and a suction picker near the pressing pad.

17 Claims, 10 Drawing Sheets

(51) Int. Cl.
*H01L 23/544* (2006.01)
*H01L 51/56* (2006.01)
*G02F 1/13* (2006.01)
*G02F 1/1333* (2006.01)
*H01L 51/00* (2006.01)
*H01L 27/32* (2006.01)

(52) U.S. Cl.
CPC .......... H01L 21/681 (2013.01); H01L 23/544 (2013.01); H01L 51/56 (2013.01); *G02F 1/133354* (2021.01); *G02F 2202/022* (2013.01); *H01L 27/3293* (2013.01); *H01L 51/0096* (2013.01); *H01L 2223/5442* (2013.01); *H01L 2223/5448* (2013.01); *H01L 2223/54426* (2013.01); *H01L 2251/566* (2013.01)

(58) Field of Classification Search
CPC ................ H01L 51/56; H01L 51/0096; H01L 2223/54426; H01L 2223/5448; H01L 2223/5442; H01L 2251/566; H01L 27/3293; G02F 1/1303; G02F 1/133351; G02F 2001/133354; H05K 3/30; G02B 6/4221; B29D 11/0024

USPC ....... 83/24, 13; 414/752.1; 198/468.4–468.9; 340/5.8
See application file for complete search history.

(56) References Cited

U.S. PATENT DOCUMENTS

| | | | |
|---|---|---|---|
| 2002/0025656 A1* | 2/2002 | Arai | .................. H01L 21/67132 257/E21.599 |
| 2005/0003636 A1 | 1/2005 | Takyu et al. | |
| 2006/0285965 A1 | 12/2006 | Kabeshita et al. | |
| 2012/0248939 A1* | 10/2012 | Funabiki | ................ G04R 20/10 310/348 |
| 2016/0216564 A1 | 7/2016 | Miyachi et al. | |
| 2017/0271208 A1 | 9/2017 | Koshimizu et al. | |
| 2019/0023003 A1* | 1/2019 | Verheijen | ............. B41J 2/04505 |

FOREIGN PATENT DOCUMENTS

| | | | |
|---|---|---|---|
| CN | 207215016 U | * | 4/2018 |
| JP | 2015154030 A | * | 8/2015 |
| KR | 10-2009-0051415 A | | 5/2009 |
| KR | 10-2010-0123412 A | | 11/2010 |
| KR | 10-1296808 B1 | | 8/2013 |
| KR | 10-2014-0031538 A | | 3/2014 |

* cited by examiner

APPARATUS AND METHOD FOR MANUFACTURING DISPLAY DEVICE

CROSS-REFERENCE TO RELATED APPLICATIONS

This application is a divisional of U.S. patent application Ser. No. 16/057,536, filed on Aug. 7, 2018, which claims priority to and the benefit of Korean Patent Application No. 10-2017-0120467, filed on Sep. 19, 2017 in the Korean Intellectual Property Office, the entire disclosure of each of which is incorporated herein by reference.

BACKGROUND

1. Field

Aspects of embodiments of the present disclosure relate to an apparatus and method for manufacturing a display device.

2. Description of the Related Art

The importance of display devices has steadily grown with recent developments in multimedia technology. As a result, a variety of display devices, such as a liquid crystal display (LCD) device, an organic light-emitting display device, and the like, have been developed and widely used.

In order to fabricate a display device, a plurality of processes may be performed. Some of the plurality of processes may be performed in the same place or in different places. In a case in which several processes are performed in different places, elements and parts subjected to the processes need to be transferred from one place to another place.

In order to transfer elements and parts, various transportation means are needed. Accordingly, the stability and the speed of the transportation means need to be ensured.

SUMMARY

According to an aspect of one or more exemplary embodiments of the present disclosure, an apparatus for manufacturing a display device is capable of reducing a processing time.

According to another aspect of one or more exemplary embodiments of the present disclosure, a method of manufacturing a display device is capable of reducing a processing time.

However, aspects and features of exemplary embodiments of the present disclosure are not restricted to those set forth herein. The above and other aspects of exemplary embodiments of the present disclosure will become more apparent to one of ordinary skill in the art to which the present disclosure pertains by referencing the further detailed description of some exemplary embodiments of the present disclosure provided below.

According to one or more exemplary embodiments of the present disclosure, an apparatus for manufacturing a display device includes: a pressing pad including a body portion and a vision hole penetrating the body portion; a vision camera above the vision hole; and a suction picker near the pressing pad.

The pressing pad may further include a pressing portion below the body portion, and the vision hole may penetrate the body portion and the pressing portion.

The pressing portion may be formed of an elastic material.

The body portion may be frame-shaped in a plan view.

The body portion may be ring-shaped in a plan view.

The apparatus may further include a stage to support a plurality of unit substrates.

At least one alignment mark may be formed on each of the unit substrates, and the vision camera may be configured to recognize the at least one alignment mark through the vision hole.

The pressing pad may be movable downward in a z-axis direction to press each of the unit substrates.

The pressing pad and the suction picker may be movable downward in the z-axis direction to be concurrently placed in contact with each of the unit substrates.

A distance from a top surface of the stage to the vision camera may be defined as a first height, a distance from the top surface of the stage to the pressing pad may be defined as a second height, and a value obtained by dividing the second height by the first height may be 0.4 to 0.5.

The vision camera and the vision hole may be aligned in a z-axis direction.

The apparatus may further include a connecting portion connecting the pressing pad and the vision camera.

A bottom of the pressing pad and a bottom of the suction picker may be on a same plane.

A planar area recognized by the vision camera may be defined as a vision area, a planar area occupied by the vision hole may be defined as a penetration area, and a value obtained by dividing the area of the penetration area by the area of the vision area may be 0.8 or greater.

A center of the vision area and a center of the penetration area may be on a same line parallel to a z-axis direction.

The vision camera, the pressing pad, and the suction picker may be connected to one another and may be movable as one integral body.

According to another exemplary embodiment of the present disclosure, a method of manufacturing a display device includes: cutting a mother substrate into a plurality of unit substrates; and lifting each of the unit substrates using a pickup assembly, and the pickup assembly includes a pressing pad including a body portion and a vision hole penetrating the body portion, and a vision camera above the vision hole, and the lifting each of the unit substrates comprises pressing each of the unit substrates with the pressing pad.

The lifting each of the unit substrates may further include allowing the vision camera to identify an alignment mark, formed on each of the unit substrates, through the vision hole.

The pickup assembly may further include a suction picker near the pressing pad, and if the vision camera recognizes the alignment mark, formed on each of the unit substrates, through the vision hole, the suction picker may fix the corresponding unit substrate in a vacuum suction manner.

Each of the unit substrates may include a base substrate and at least one protective film attached on the base substrate, and the method may further include peeling off the at least one protective film.

According to the aforementioned and other exemplary embodiments of the present disclosure, a processing time can be reduced by lowering an error rate of a pickup assembly.

Other features and exemplary embodiments may be apparent to those skilled in the art from the following description, the drawings, and the claims.

BRIEF DESCRIPTION OF THE DRAWINGS

The above and other exemplary embodiments and features of the present disclosure will become more apparent by describing in further detail some exemplary embodiments thereof with reference to the attached drawings, in which.

DETAILED DESCRIPTION

Figure 1:
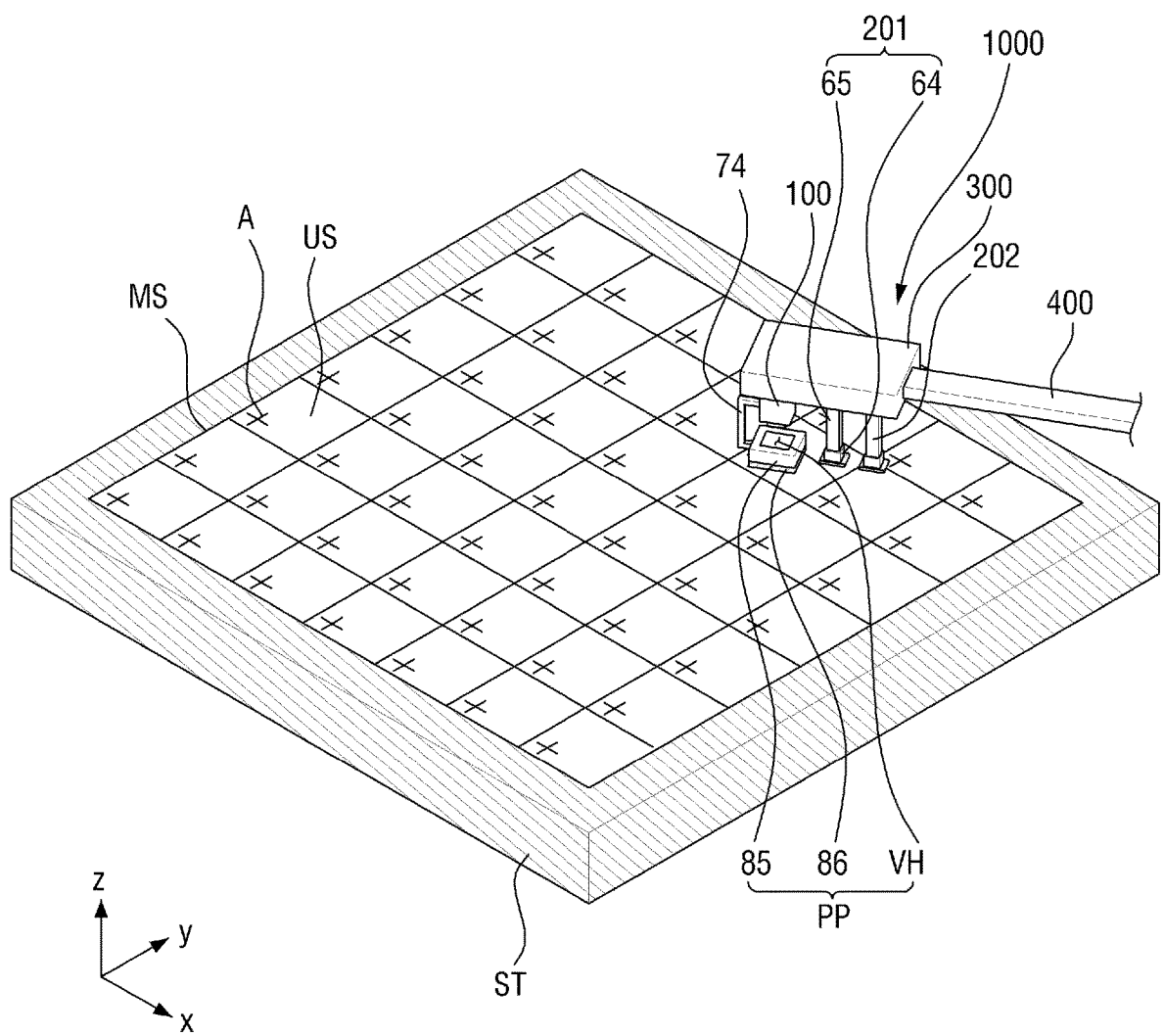
FIG. 1 is a perspective view of an apparatus for manufacturing a display device according to an exemplary embodiment of the present disclosure.

Aspects and features of the present invention and methods for achieving the aspects and features will be apparent by referring to some exemplary embodiments to be described in further detail with reference to the accompanying drawings. However, the present invention is not limited to the exemplary embodiments disclosed hereinafter, but can be implemented in any of diverse forms. The matter defined in the description, such as the detailed construction and elements, are provided to assist those of ordinary skill in the art in a comprehensive understanding of the invention, and the present invention is defined within the scope of the appended claims.

Where an element is described as being related to another element, such as being "on" another element or "located on" a different layer or a layer, this includes both a case in which an element is located directly on another element or a layer and a case in which an element is located on another element via another layer or still another element. In contrast, where an element is described as being related to another element, such as being "directly on" another element or "located directly on" a different layer or a layer, this indicates a case in which an element is located on another element or a layer with no intervening element or layer therebetween. Throughout the description of the present invention, the same drawing reference numerals are used for the same elements across various figures.

Although the terms "first," "second," and so forth may be used to describe diverse constituent elements, such constituent elements are not limited by the terms. The terms are used to discriminate a constituent element from other constituent elements. Accordingly, in the following description, a "first" constituent element may be a "second" constituent element.

The terminology used herein is for the purpose of describing particular embodiments and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It is to be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It is to be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower" can, therefore, encompass both an orientation of lower and upper, depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It is to be further understood that terms, such as those defined in commonly used dictionaries, should be interpreted as having a meaning that is consistent with their meaning in the context of the relevant art and the present disclosure, and are not to be interpreted in an idealized or overly formal sense unless expressly so defined herein.

Exemplary embodiments may be described herein with reference to cross-sectional illustrations that are schematic illustrations of idealized embodiments. As such, variations from the shapes of the illustrations as a result, for example, of manufacturing techniques and/or tolerances, may be expected. Thus, embodiments described herein should not be construed as limited to the particular shapes of regions as illustrated herein, but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures may be schematic in nature and their shapes are not intended to limit the precise shape of a region and are not intended to limit the scope of the present claims.

Herein, some exemplary embodiments of the present invention will be described with reference to the attached drawings.

Figure 2:
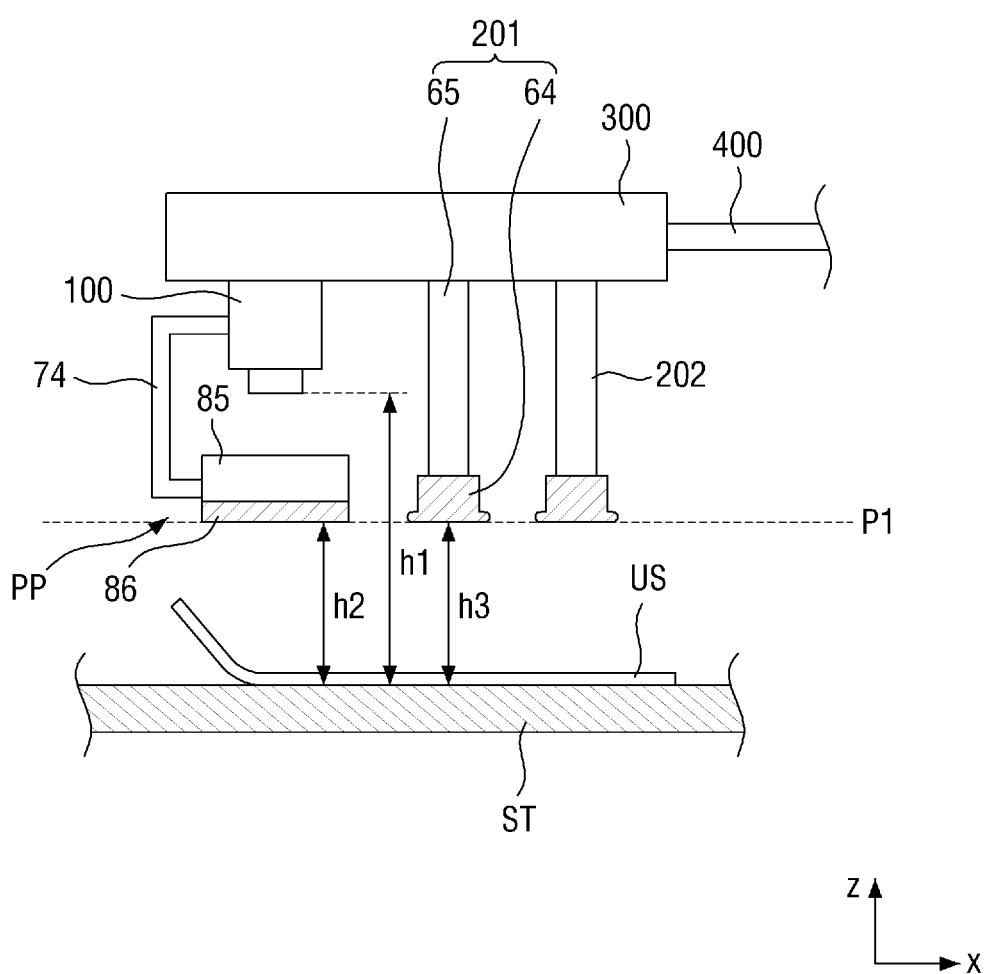
FIG. 2 is a side view of the apparatus according to the exemplary embodiment of FIG. 1.

FIG. 1 is a perspective view of an apparatus for manufacturing a display device according to an exemplary embodiment of the present disclosure. FIG. 2 is a side view of the apparatus according to the exemplary embodiment of FIG. 1.

Referring to FIGS. 1 and 2, the apparatus may include a pickup assembly 1000. The pickup assembly 1000 includes a pressing pad PP, which includes a body portion 85 and a vision hole VH that penetrates the body portion 85, a vision camera 100, which is disposed above the vision hole VH, and suction pickers 201 and 202, which are disposed on a side of the pressing pad PP.

The apparatus may further include a stage ST and a base 300, which faces the stage ST. The stage ST and the base 300 will be described below.

The stage ST may provide a space for receiving a mother substrate MS including a plurality of unit substrates US. That is, the mother substrate MS, which is divided into the unit substrates US, may be disposed on the stage ST.

In an exemplary embodiment, the stage ST may include a seating portion (not illustrated) for stably receiving the mother substrate MS.

In another exemplary embodiment, the stage ST may include a fastening means for fastening the mother substrate MS. The fastening means may fasten the mother substrate by, for example, directly contacting the mother substrate MS or using a vacuum suction method.

The mother substrate MS may include the unit substrates US. The unit substrates US may be obtained by cutting the mother substrate MS into cell units in a cutting step S1 that will be described later with reference to FIG. 7.

Each of the unit substrates US may form a single cell.

Figure 3:
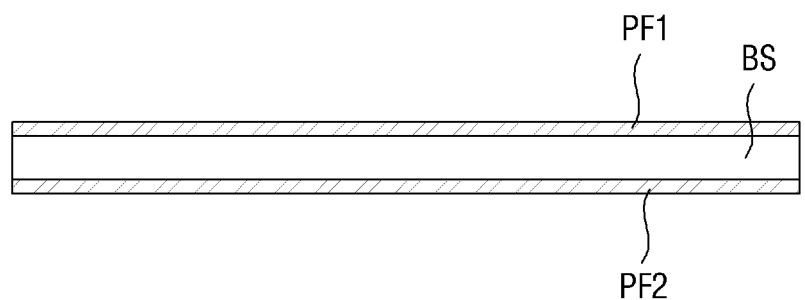
FIG. 3 is a cross-sectional view of a target object of the apparatus according to the exemplary embodiment of FIG. 1.

FIG. 3 is a cross-sectional view of a target object of the apparatus according to the exemplary embodiment of FIG. 1.

Referring to FIG. 3, in an embodiment, a unit substrate US may include a base substrate BS, a first protective film PF1, which is disposed on the base substrate BS, and a second protective film PF2, which is disposed below the base substrate BS. In an embodiment, the first and second protective films PF1 and PF2 may be removed in a peeling step S3 that will be described later.

In an exemplary embodiment, the base substrate BS may be a substrate that is applicable to an organic light-emitting display device. In this exemplary embodiment, first and second electrodes (not illustrated) facing each other and an organic light-emitting layer (not illustrated) disposed between the first and second electrodes may be formed on the base substrate BS.

In another exemplary embodiment, the base substrate BS may be a substrate that is applicable to a liquid crystal display (LCD) device. In this exemplary embodiment, the base substrate BS may include a pair of opposing substrates (not illustrated) facing each other and a liquid crystal layer (not illustrated) disposed between the opposing substrates.

In an exemplary embodiment, the base substrate BS may comprise polyimide (PI). However, embodiments of the present disclosure are not limited thereto.

Referring again to FIG. 1, at least one alignment mark A may be formed on each of the unit substrates US. The alignment mark A may be recognized by the vision camera 100 that will be described later.

In an exemplary embodiment, the alignment mark A may be formed at a corner of each of the unit substrates US. FIG. 1 illustrates an example in which one alignment mark A is formed at a corner of each of the unit substrates US, but the locations and the number of alignment marks A formed are not particularly limited.

In another exemplary embodiment, a plurality of alignment marks A may be formed at various locations on each of the unit substrates US.

The base 300 may be disposed to be spaced apart from the stage ST and to face the stage ST. The base 300 may support the pressing pad PP, the vision camera 100, and the suction pickers 201 and 202. In an embodiment, the pressing pad PP, the vision camera 100, and the suction pickers 201 and 202 may be coupled to, or formed in one integral body with, the base 300.

In an exemplary embodiment, the pressing pad PP may be disposed below the base 300. In an exemplary embodiment, the pressing pad PP may include the body portion 85, a pressing portion 86, and the vision hole VH.

In an exemplary embodiment, the body portion 85 may be a distance (e.g., a predetermined distance) apart from the base 300. In an exemplary embodiment, the body portion 85 may be formed of a rigid material. For example, the body portion 85 may be formed of a metal or a plastic, but the present disclosure is not limited thereto. That is, the material of the body portion 85 is not particularly limited.

The pressing portion 86 may be disposed below the body portion 85. The pressing portion 86 may overlap with the body portion 85. In an exemplary embodiment, the pressing portion 86 may have a same planar shape as the body portion 85. In an exemplary embodiment, the pressing portion 86 may completely overlap with the body portion 85.

In an exemplary embodiment, the body portion 85 may have a shape of a frame having a hollow portion in a plan view. Accordingly, the pressing portion 86 may also be in the shape of a frame having a hollow portion and having a same size as the body portion 85 in a plan view.

In another exemplary embodiment, the body portion 85 may have a shape of a closed curve (for example, a ring) having a hollow portion in a plan view.

In this exemplary embodiment, the pressing portion 86 may also be in the shape of a closed curve having a hollow portion and having a same size as the body portion 85.

The pressing portion 86 may be placed in direct contact with each of the unit substrates US. Accordingly, the pressing portion 86 may be formed of a material with elasticity. For example, the pressing portion 86 may be formed of rubber or a synthetic resin. In an exemplary embodiment, the pressing portion 86 may have a soft structure like that of sponge.

The pressing portion 86 may be placed in direct contact with each of the unit substrates US, and if the pressing portion 86 is rigid, the pressing portion 86 may cause damage to the unit substrates US. On the other hand, if the pressing portion 86 is formed of an elastic material or has a structure like that of sponge, the unit substrates US may be prevented or substantially prevented from being damaged.

The vision hole VH may be formed to penetrate both the body portion 85 and the pressing portion 86. Accordingly, the body portion 85 and the pressing portion 86 may both have a hollow portion in a plan view, as described above. In an exemplary embodiment, the vision hole VH may be open in a z-axis direction. Thus, when the vision hole VH is viewed in the z-axis direction (e.g., a direction from the top to the bottom of the vision hole VH of FIG. 1), the alignment mark A of each of the unit substrates US may be viewed through the vision hole VH from below the vision hole VH in the z-axis direction.

The vision camera 100 may be disposed above the vision hole VH. The vision camera 100 and the vision hole VH may be aligned in the z-axis direction. In other words, the center of the vision camera 100 and the center of the vision hole VH may be aligned with each other in the z-axis direction.

The vision camera 100 may recognize the alignment mark A formed on each of the unit substrates US through the vision hole VH.

In an exemplary embodiment, the vision camera 100 may be a charge-coupled device (CCD) camera, but the present disclosure is not limited thereto. The vision camera 100 may be understood as encompassing nearly all means capable of recognizing an image or a particular pattern.

The vision camera 100 may be connected to the base 300. In an embodiment, the vision camera 100 may be formed to extend from the base 300 in the z-axis direction.

In an embodiment, a connecting portion 74 may be disposed between the vision camera 100 and the pressing pad PP. That is, the connecting portion 74 may connect the vision camera 100 and the pressing pad PP and may thus fasten the vision camera 100 and the pressing pad PP together.

In an embodiment, the camera 100 and the pressing pad PP, connected by the connecting portion 74, may operate as one integral body. For example, as the vision camera 100 moves in a horizontal direction by a distance (e.g., a predetermined distance), the pressing pad PP, connected to the vision camera 100, may also move in the horizontal direction along with the vision camera 100.

The movement of the vision camera 100 and the pressing pad PP will be described later in further detail.

Figure 4:
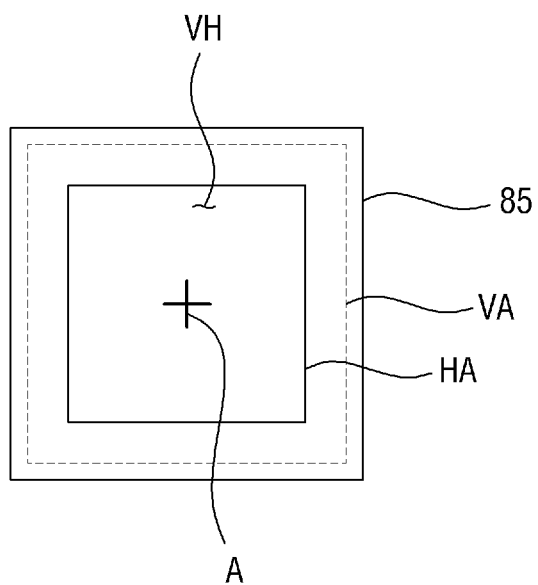
FIG. 4 is a partial plan view of the apparatus according to the exemplary embodiment of FIG. 1.
Figure 4:
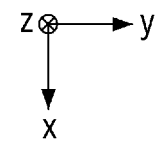

FIG. 4 is a partial plan view of the apparatus according to the exemplary embodiment of FIG. 1. Referring to FIG. 4, a vision area VA of the vision camera 100 and a penetration area HA of the vision hole VH may at least partially overlap with each other.

The vision area VA of the vision camera 100 may be a maximum area that can be captured from one plane by the vision camera 100. The penetration area HA of the vision hole VH may be the area of a cross-section of the vision hole VH, taken along an x-y plane.

As described above, the center of the vision camera 100 and the center of the vision hole VH may be aligned with each other in the z-axis direction. In other words, the center of the vision camera 100 and the center of the vision hole VH may be disposed on a same straight line parallel to a z axis.

In this case, the center of the vision area VA and the center of the penetration area HA may be aligned with each other in the z-axis direction. That is, the center of the vision area VA and the center of the penetration area HA may be disposed on a same line extending parallel to the z-axis direction.

In an exemplary embodiment, the size of the vision area VA and the size of the penetration area HA may be substantially the same.

In another exemplary embodiment, the value obtained by dividing the area of the penetration area HA by the area of the vision area VA may be 0.8 or greater. If the value obtained by dividing the area of the penetration area HA by the area of the vision area VA is less than 0.8, there may be a difficulty in recognizing the alignment mark A of each of the unit substrates US through the vision hole VH. On the other hand, if the value obtained by dividing the area of the penetration area HA by the area of the vision area VA is 0.8 or greater, the vision camera 100 can precisely recognize the alignment mark A of each of the unit substrates US through the vision hole VH.

Referring again to FIG. 1, at least one suction picker may be disposed on one side of the pressing pad PP. FIG. 1 illustrates an example in which the first and second suction pickers 201 and 202 are disposed near the pressing pad PP.

FIG. 1 illustrates an example in which two suction pickers are provided, but the number of suction pickers is not particularly limited. That is, one suction picker or three or more suction pickers may be provided.

The second suction picker 202 may be substantially the same as the first suction picker 201. The first suction picker 201 will herein be described. The following description of the first suction picker 201 may be directly applicable to the second suction picker 202 or other suction pickers that may also be provided.

In an exemplary embodiment, the first suction picker 201 may include a supporting bar 65 and a suction pad 64.

The supporting bar 65 may extend from the base 300 and may support the suction pad 64. The suction pad 64 may be disposed at one end of the supporting bar 65. The suction pad 64 may be placed in contact with each of the unit substrates US and may thus lift up each of the unit substrates US.

In an exemplary embodiment, the suction pad 64 may fix each of the unit substrates US in a vacuum suction manner. In this exemplary embodiment, the supporting bar 65, which is connected to the suction pad 64, may include a vacuum path provided for the suction pad 64 to create a vacuum.

The relationship between the pressing pad PP and the first and second suction pickers 201 and 202 will herein be described with reference to FIG. 2.

Referring to FIG. 2, in an exemplary embodiment, a bottom of the pressing pad PP (particularly, the bottom of the pressing portion 86) and a bottom of the suction pad 64 may be disposed on an imaginary first plane P1.

In this exemplary embodiment, in response to the base 300 being moved downward in the z-axis direction, the bottom of the pressing pad PP and the bottom of the suction pad 64 may be concurrently (e.g., simultaneously) placed in contact with a unit substrate US.

For convenience, some terms will herein be defined first. A height from a top surface of the stage ST to the vision camera 100 will herein be referred to as a first height h1; a height from the top surface of the stage ST to the bottom of the pressing pad PP will herein be referred to as a second height h2; and a height from the top surface of the stage ST to the bottom of the suction pad 64 will herein be referred to as a third height h3.

In the case in which the bottom of the pressing pad PP and the bottom of the suction pad 64 are disposed on the same plane, as mentioned above, the second and third heights h2 and h3 may be substantially the same.

In an exemplary embodiment, the value obtained by dividing the second height h2 by the first height h1 may be 0.4 to 0.5. In this exemplary embodiment, the vision camera 100 can precisely recognize an alignment mark A formed on the unit substrate US through the vision hole VH.

The operation of the apparatus for manufacturing a display device according to an exemplary embodiment of the present disclosure will herein be described with reference to FIGS. 1, 2, and 5.

Figure 5:
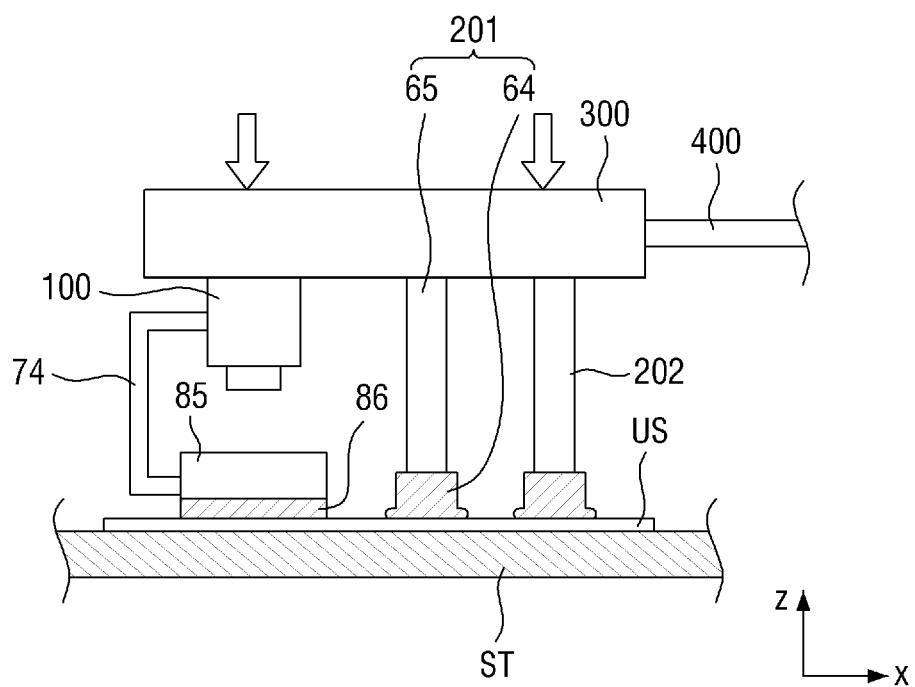
FIG. 5 is a side view of the apparatus according to the exemplary embodiment of FIG. 1.

FIG. 5 is a side view of the apparatus for manufacturing a display device according to an exemplary embodiment of the present disclosure.

Referring to FIG. 5, in an exemplary embodiment, the base 300 may be connected to a driving rod 400. The driving rod 400 may provide a driving force to the base 300. For example, the driving rod 400 may move the base 300 linearly in any direction selected from among an x-axis direction, a y-axis direction, and the z-axis direction.

The driving rod 400 may rotate the base 300 about any one of a first rotational axis, which is parallel to an x axis, a second rotational axis, which is parallel to a y axis, and a third rotational axis, which is parallel to the z axis.

In an exemplary embodiment, the vision camera 100, the first suction picker 201, the second suction picker 202, and the pressing pad PP, which are all coupled to the base 300, may be concurrently (e.g., simultaneously) movable as one integral body, but the present disclosure is not limited thereto. In another exemplary embodiment, the vision camera 100, the first suction picker 201, the second suction picker 202, and the pressing pad PP may be movable independently of one another.

In an exemplary embodiment, the pickup assembly 1000 may receive the driving force provided by the driving rod 400 and may thus move over the x-y plane. The pickup assembly 1000 may move to an input location (e.g., a predetermined input location) on the x-y plane or to a location for lifting up a particular unit substrate US.

Referring to FIG. 2, a curl may be formed at a corner portion of the unit substrate US. The unit substrate US may be very thin, and a curl may be formed at an end of the unit substrate US due to, for example, static electricity. If a curl is formed in the unit substrate US, the alignment mark A formed at a corner portion of the unit substrate US may not be able to be precisely recognized, even if the vision camera 100 is moved down.

Referring to FIG. 5, the pickup assembly 1000, disposed above a unit substrate US, may be moved down in the z-axis direction. As the pickup assembly 1000 is moved down in the z-axis direction, the pressing portion 86 and the suction pad 64 may be concurrently (e.g., simultaneously) placed in contact with the unit substrate US. Then, the pressing portion 86 presses a curled portion of the unit substrate US, and, as a result, the unit substrate US may be flattened. In this case, an alignment mark A formed on the unit substrate US may overlap with the pressing pad PP, particularly, the vision hole VH. Accordingly, the vision camera 100 may be able to recognize the alignment mark A through the vision hole VH. In a case in which the vision camera 100 does not recognize the alignment mark A, the pickup assembly 1000 needs to be lifted up and then moved down again. Once the vision camera 100 becomes able to recognize the alignment mark A through the vision hole VH while the curled portion of the unit substrate US is being pressed with the pressing portion 86, any loss in processing time that may be caused by recognition failure can be reduced or minimized.

Once the vision camera 100 recognizes the alignment mark A, the suction pad 64 may drive a vacuum and may thus adhere to the unit substrate US. Accordingly, the unit substrate US may be fixed to the pickup assembly 1000, and the pickup assembly 1000 may be able to move the unit substrate US fixed thereto to another place (e.g. a predetermined place) for subsequent processing.

Figure 6:
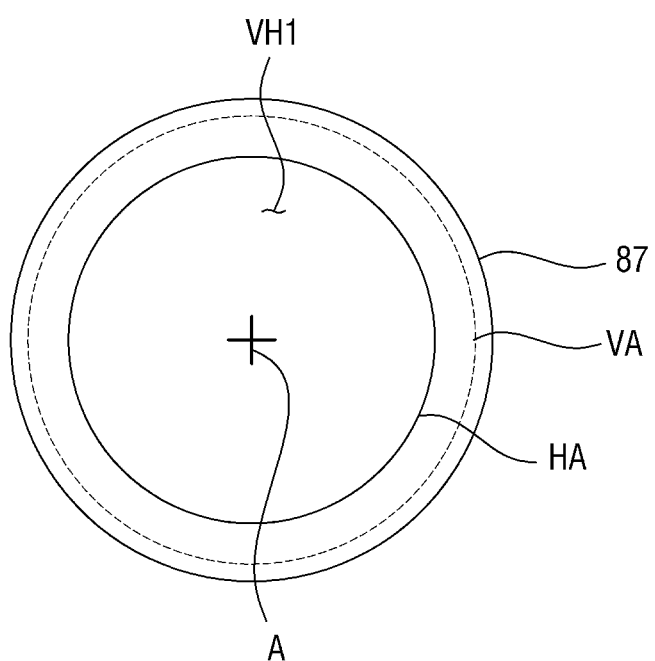
FIG. 6 is a partial plan view of an apparatus for manufacturing a display device according to another exemplary embodiment of the present disclosure.
Figure 6:
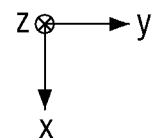

An apparatus for manufacturing a display device according to another exemplary embodiment of the present disclosure will herein be described. In FIGS. 4 and 6, like reference numerals indicate like elements, and, thus, descriptions thereof will be omitted or simplified.

FIG. 6 is a partial plan view of an apparatus for manufacturing a display device according to another exemplary embodiment of the present disclosure.

Referring to FIG. 6, the apparatus of FIG. 6 differs from the apparatus of FIG. 4 in that a planar shape of a vision hole VH1 is circular. In an exemplary embodiment, the planar shape of the vision hole VH1 may be circular. In this exemplary embodiment, a body portion 87 may have a shape of a ring having a hollow portion.

In the case in which the planar shape of the vision hole VH1 is circular, the planar shape of a vision area VA of a vision camera 100 may also be circular.

In an exemplary embodiment, the center of the vision area VA of the vision camera 100 and the center of a penetration area HA of the vision hole VH1 may be aligned in a z-axis direction. In other words, the center of the vision area VA of the vision camera 100 and the center of the penetration area HA of the vision hole VH1 may be disposed on a same line parallel to the z axis.

In an exemplary embodiment, the value obtained by dividing the area of the penetration area HA of the vision hole VH1 by the area of the vision area VA of the vision camera 100 may be 0.8 or greater.

As described above, if the value obtained by dividing the area of the penetration area HA of the vision hole VH1 by the area of the vision area VA of the vision camera 100 is 0.8 or greater, the vision camera 100 can precisely recognize an alignment mark A formed on each unit substrate US through the vision hole VH1.

A method of manufacturing a display device according to some exemplary embodiments of the present disclosure will herein be described. In FIGS. 1 through 10, like reference numerals indicate like elements, and, thus, detailed descriptions thereof will be omitted.

Figure 7:
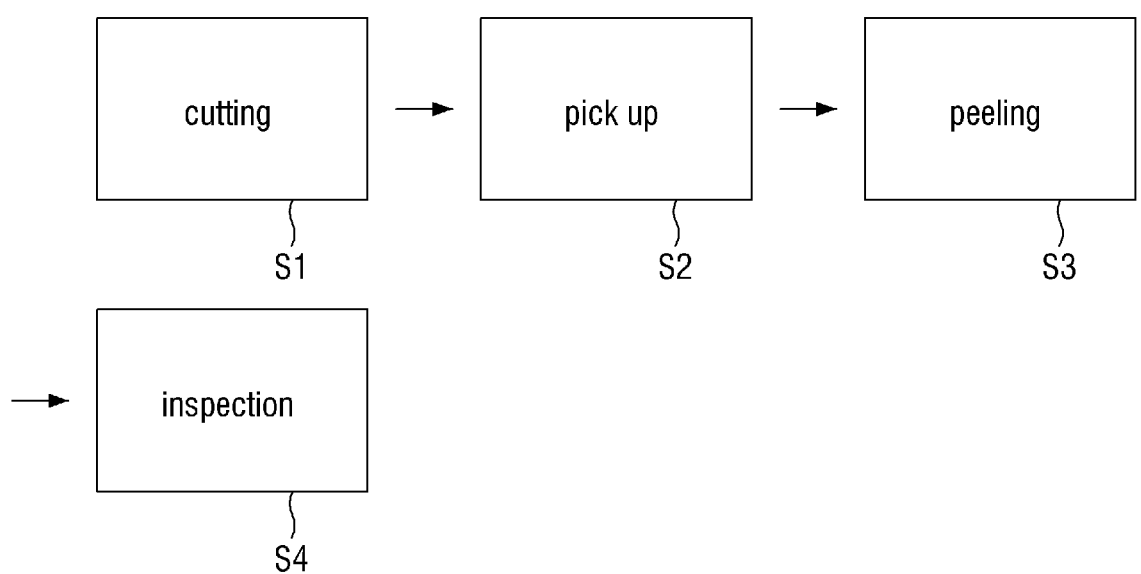
FIG. 7 is a block diagram illustrating a method of manufacturing a display device according to an exemplary embodiment of the present disclosure.

FIG. 7 is a block diagram illustrating a method of manufacturing a display device according to an exemplary embodiment of the present disclosure.

Referring to FIG. 7, the method may include a cutting step (S1), a pickup step (S2), a peeling step (S3), and an inspection step (S4).

Figure 8:
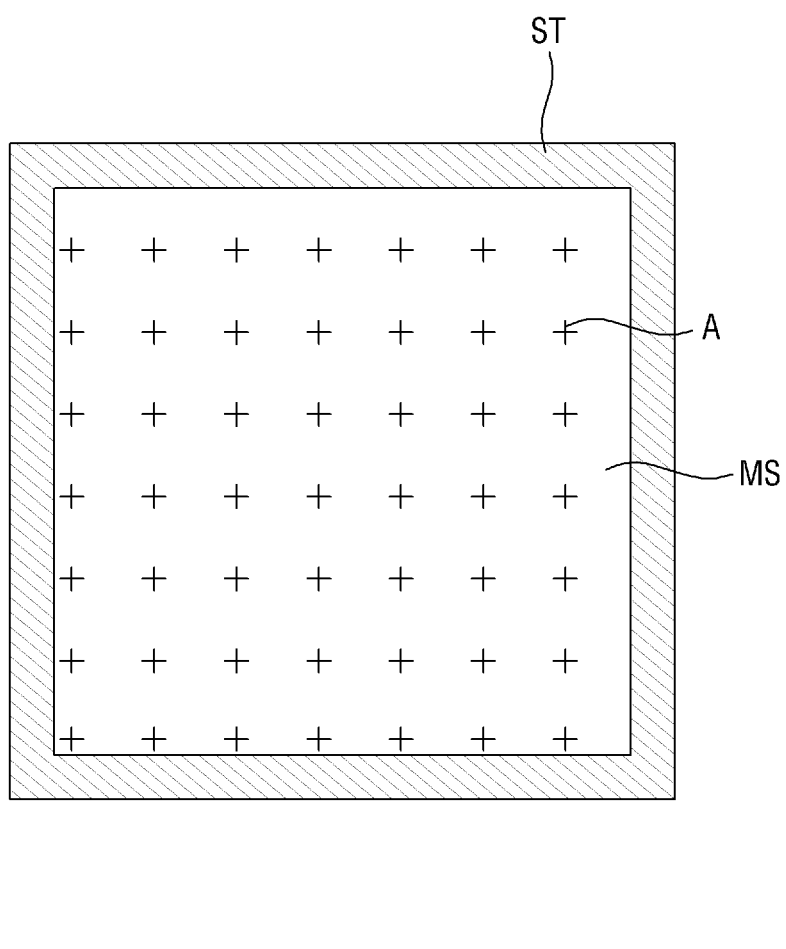
FIG. 8 is a plan view illustrating a cutting step of the method according to the exemplary embodiment of FIG. 7.
Figure 9:
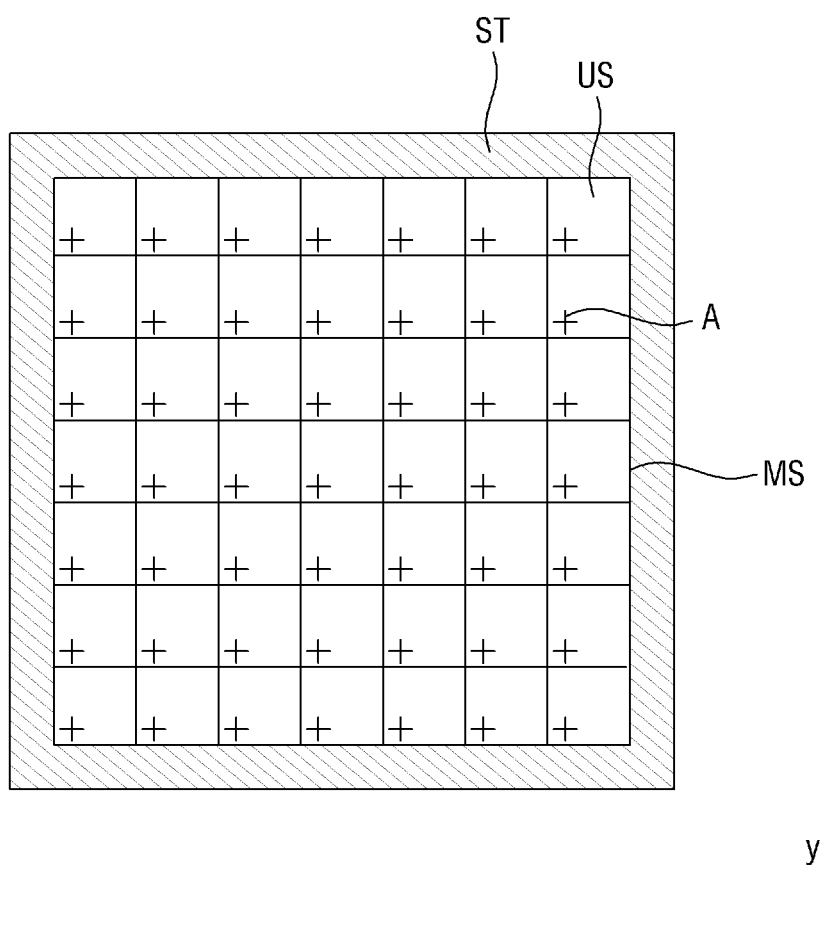
FIG. 9 is a plan view illustrating the cutting step of the method according to the exemplary embodiment of FIG. 7.

FIGS. 8 and 9 are plan views illustrating a cutting step of the method according to the exemplary embodiment of FIG. 7.

Referring to FIGS. 8 and 9, the cutting step S1 may include preparing a mother substrate MS on a stage ST.

The mother substrate MS may be a substrate providing materials for manufacturing a plurality of display devices.

In an exemplary embodiment, a plurality of alignment marks A may be disposed on the mother substrate MS. In an exemplary embodiment, each of the alignment marks A may correspond to a single unit substrate US.

FIG. 8 illustrates an example in which the alignment marks A are formed on the mother substrate MS before the cutting step S1, but the present disclosure is not limited thereto. In another example, the alignment marks A may be formed after the cutting step S1.

Thereafter, referring to FIG. 9, the cutting step S1 may further include separating the mother substrate MS into a plurality of unit substrates US.

In an exemplary embodiment, a plurality of horizontal cutting lines and a plurality of vertical cutting lines may be formed on the mother substrate MS.

In an exemplary embodiment, the horizontal cutting lines and the vertical cutting lines may be formed by using a laser, but the present disclosure is not limited thereto. In another exemplary embodiment, the horizontal cutting lines and the vertical cutting lines may be formed in a direct contact manner.

Once the horizontal cutting lines and the vertical cutting lines are formed, as illustrated in FIG. 9, the mother substrate MS may be separated into a plurality of unit substrates US. The unit substrates US in their cut state may be placed in contact with their respective neighboring unit substrates US.

Figure 10:
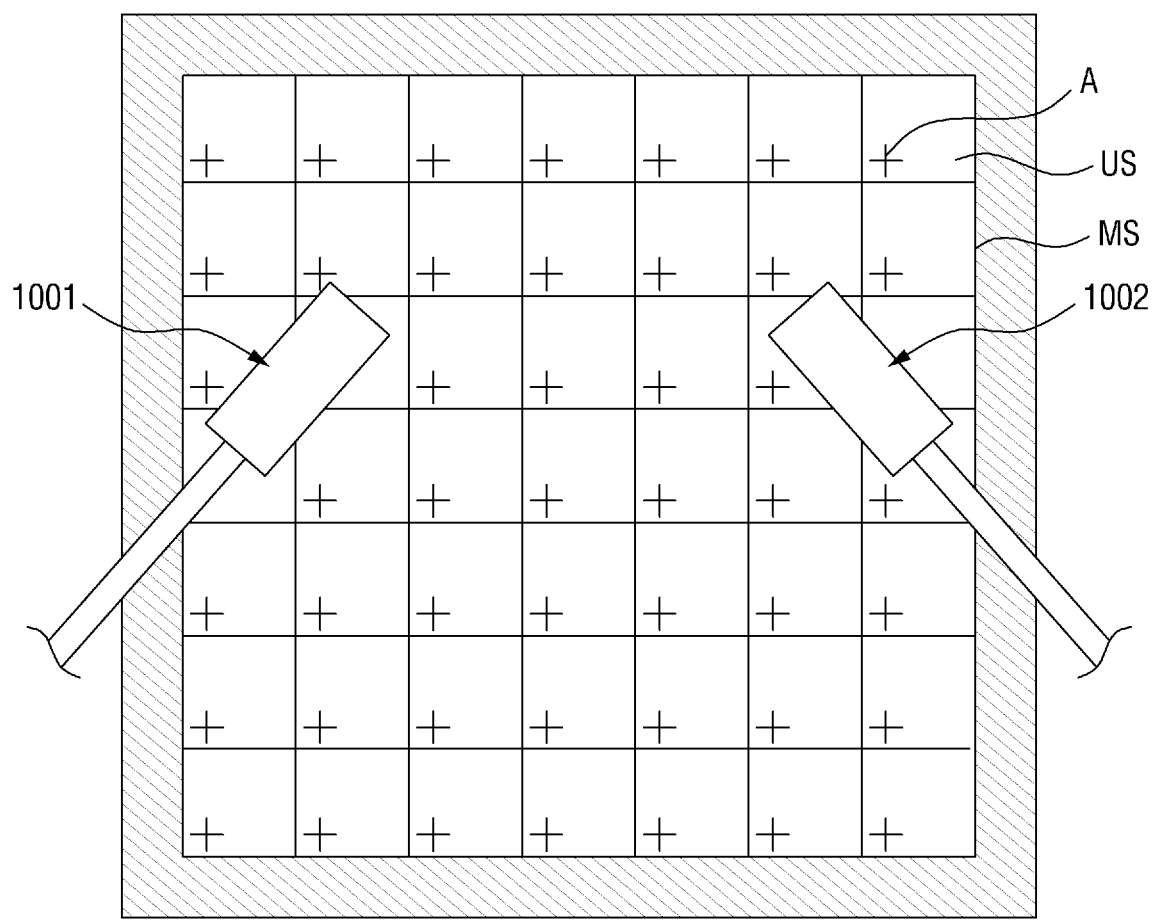
FIG. 10 is a plan view illustrating a pickup step of the method according to the exemplary embodiment of FIG. 7.
Figure 10:
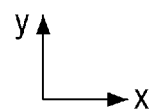

FIG. 10 is a plan view illustrating the pickup step S2 of the method according to the exemplary embodiment of FIG. 7. Referring to FIG. 10, at least one pickup assembly may be disposed over the stage ST. FIG. 10 illustrates an example in which first and second pickup assemblies 1001 and 1002 are disposed over the stage ST. In an embodiment, the first and second pickup assemblies 1001 and 1002 may be substantially the same as the pickup assembly 1000 according to the exemplary embodiment of FIG. 1.

FIG. 10 illustrates an example in which two pickup assemblies are disposed over the stage ST, but the number of pickup assemblies is not particularly limited. In other examples, one pickup assembly or three or more pickup assemblies may be provided.

In an embodiment, the first and second pickup assemblies 1001 and 1002 may lift up each of the unit substrates US in the same manner as described above with reference to FIGS. 1, 2, and 5.

The first and second pickup assemblies 1001 and 1002 may lift up and move each of the unit substrates US for subsequent processing. Once each of the unit substrates US is transferred by the first and second pickup assemblies 1001 and 1002, the corresponding unit substrate US may be subjected to the peeling step S3.

In the peeling step S3, first and second protective films PF1 and PF2 may be peeled off from the top and the bottom, respectively, of each of the unit substrates US. Thereafter, the inspection step S4 may be performed. The inspection step S4 may include an exterior inspection and may determine whether the first and second protective films PF1 and PF2 have been completely removed from each of the unit substrates US in the peeling step S3.

However, effects of the present invention are not restricted to that set forth herein. The above and other effects of the present invention will become more apparent to one of ordinary skill in the art to which the present invention pertains by referencing the claims.

While the present invention has been particularly illustrated and described with reference to some exemplary embodiments thereof, it will be understood by those of ordinary skill in the art that various changes in form and detail may be made therein without departing from the spirit and scope of the present invention as set forth by the following claims. The exemplary embodiments should be considered in a descriptive sense and not for purposes of limitation.

What is claimed is:

1. An apparatus for manufacturing a display device, the apparatus comprising:
   a pressing pad including a body portion and having a vision hole penetrating the body portion;
   a vision camera above a top surface of the pressing pad and overlapping the vision hole; and
   a suction picker comprising a suction pad configured to fix a first unit substrate in a vacuum suction manner in response to at least one alignment mark on the first unit substrate being recognized by the vision camera, the suction picker being separated from, and spaced in a lateral direction from, the body portion,
   wherein the pressing pad is placed in contact with the first unit substrate to flatten the first unit substrate.

2. The apparatus of claim 1, wherein
   the pressing pad further includes a pressing portion below the body portion, and
   the vision hole penetrates the body portion and the pressing portion.

3. The apparatus of claim 2, wherein the pressing portion is formed of an elastic material.

4. The apparatus of claim 1, wherein the body portion has a shape of a frame surrounding the vision hole in a plan view.

5. The apparatus of claim 1, wherein the body portion is ring-shaped in a plan view.

6. The apparatus of claim 1, further comprising a stage to support a plurality of unit substrates including the first unit substrate.

7. The apparatus of claim 6, wherein
   the at least one alignment mark is formed on each of the unit substrates, and
   the vision camera is configured to recognize the at least one alignment mark through the vision hole.

8. The apparatus of claim 6, wherein the pressing pad is movable downward in a z-axis direction to press each of the unit substrates.

9. The apparatus of claim 8, wherein the pressing pad and the suction picker are movable downward in the z-axis direction to be concurrently placed in contact with the first unit substrate.

10. The apparatus of claim 6, wherein
    a distance from a top surface of the stage to the vision camera is defined as a first height,
    a distance from the top surface of the stage to the pressing pad is defined as a second height, and
    a value obtained by dividing the second height by the first height is 0.4 to 0.5.

11. The apparatus of claim 1, wherein the vision camera and the vision hole are aligned in a z-axis direction.

12. The apparatus of claim 1, further comprising a connecting portion connecting the pressing pad and the vision camera.

13. The apparatus of claim 1, wherein a bottom of the pressing pad and a bottom of the fixing portion suction pad are on a same plane.

14. The apparatus of claim 1, wherein
    a planar area recognized by the vision camera is defined as a vision area,
    a planar area occupied by the vision hole is defined as a penetration area, and
    a value obtained by dividing the area of the penetration area by the area of the vision area is 0.8 or greater.

15. The apparatus of claim 14, wherein a center of the vision area and a center of the penetration area are on a same line parallel to a z-axis direction.

16. The apparatus of claim 1, wherein the vision camera, the pressing pad, and the suction picker are connected to one another and are movable as one integral body.

17. The apparatus of claim 1, wherein the suction picker is configured to move independently of the pressing pad.

* * * * *